(12) United States Patent
Palangappa et al.

(10) Patent No.: US 10,547,327 B2
(45) Date of Patent: Jan. 28, 2020

(54) SELF-CONFIGURING ERROR CONTROL CODING

(71) Applicant: Intel Corporation, Santa Clara, CA (US)

(72) Inventors: Poovaiah Manavattira Palangappa, Santa Clara, CA (US); Ravi H. Motwani, San Diego, CA (US)

(73) Assignee: INTEL CORPORATION, Santa Clara, CA (US)

( * ) Notice: Subject to any disclaimer, the term of this patent is extended or adjusted under 35 U.S.C. 154(b) by 89 days.

(21) Appl. No.: 15/631,476

(22) Filed: Jun. 23, 2017

(65) Prior Publication Data

US 2018/0375530 A1   Dec. 27, 2018

(51) Int. Cl.
*H03M 13/11*   (2006.01)
*G05B 11/42*   (2006.01)
*G06F 11/10*   (2006.01)

(52) U.S. Cl.
CPC ......... *H03M 13/1108* (2013.01); *G05B 11/42* (2013.01); *G06F 11/1032* (2013.01)

(58) Field of Classification Search
CPC ... H03M 13/1108; G05B 11/42; G06F 11/103
See application file for complete search history.

(56) References Cited

U.S. PATENT DOCUMENTS

| | | | | |
|---|---|---|---|---|
| 2007/0241712 A1* | 10/2007 | Dwyer | ................. | G05B 19/045 318/567 |
| 2010/0027301 A1* | 2/2010 | Hoyerby | ............. | H02M 3/1563 363/39 |
| 2013/0169196 A1* | 7/2013 | Markham | ................. | H02P 6/08 318/3 |
| 2015/0188570 A1* | 7/2015 | Kwok | ................. | G06F 11/1076 714/764 |
| 2016/0170871 A1* | 6/2016 | Hyun | ........................ | G06F 3/06 711/103 |
| 2016/0378594 A1 | 12/2016 | Motwani | | |
| 2017/0063400 A1* | 3/2017 | Zhang | ............... | H03M 13/1575 |
| 2017/0220007 A1* | 8/2017 | LoPiccolo | ................ | B25J 9/163 |
| 2017/0227963 A1* | 8/2017 | Klinger | ................ | G05D 1/0214 |
| 2017/0255512 A1* | 9/2017 | Zamir | ................. | H03M 13/353 |

* cited by examiner

*Primary Examiner* — Kyle Vallecillo
(74) *Attorney, Agent, or Firm* — Womble Bond Dickinson (US) LLP (57) ABSTRACT

Self-configuring error control coding in a memory device provides flexibility in terms of decoding latency, mis-correct probability, and bit-error rate performance, and avoids labor-intensive trial-and-error configuration of decoding algorithm tuning parameters, such as bit flip algorithm thresholds and syndrome-weight maps. A self-configuring decoder for error control coding allows dynamic trading of error floor performance for error rate performance and vice versa based on the performance characteristics of the decoding process.

20 Claims, 9 Drawing Sheets

500 — SYNDROME-WEIGHT TO LOGIC-STRENGTH MAPPING EXAMPLE

| {syn, con} | Mapping-1 | Mapping-2 |
|---|---|---|
| 00 | 0 | 0 |
| 01 | 2 | 2 |
| 10 | 5 | 6 |
| 11 | 7 | 8 |

SELF-CONFIGURING ERROR CONTROL CODING

TECHNICAL FIELD

The technical field relates generally to electronics, and in particular to memory error control for electronic devices.

BACKGROUND ART

Non-volatile memories such as NAND and 3D-NAND flash memory and three dimensional (3D) cross point memory, etc., are prone to hard and soft errors that result in data retrieved from memory that is different from the data stored in memory. To manage the high error rates, referred to as the raw bit-error rate, or RBER, data is often encoded in memory using storage redundancies. That is, the data is stored using more bits as compared to the actual binary representation, a technique referred to as error control coding (ECC). ECC allows data to be read and decoded even in the presence of errors. Although the encoded data is strengthened by redundancies and resilient to errors, it still exhibits an error probability popularly termed as the uncorrectable bit-error rate (UBER), typically much smaller than the RBER.

BRIEF DESCRIPTION OF THE DRAWINGS

The described embodiments are illustrated by way of example and not limitation in the figures of the accompanying drawings, in which like references indicate similar elements and in which.

Other features of the described embodiments will be apparent from the accompanying drawings and from the detailed description that follows.

DESCRIPTION OF THE EMBODIMENTS

ECC can be implemented with linear block codes that are easily decoded, such as low-density parity check (LDPC) codes. To improve decoding efficiency, a common approach is to use two-tier decoding. For example, a small decoder is used for low RBER data and a stronger decoder for high RBER data, the former referred to as hard-decision decoding (HDD) and the latter as soft-decision decoding (SDD).

Even greater decoding efficiency can be achieved, by an order of magnitude reduction in latency, with a three-tier approach that uses a bit-flipping algorithm (BFA) decoder. Among other advantages, a BFA decoder is a small, low latency unit that can handle most decoding traffic (>99%) in a typical operating environment.

A BFA decoder is an iterative decoding algorithm that carefully flips the bits of an erroneous codeword until all the syndromes are satisfied, where a syndrome refers to a parity check equation. To aid in the decoding process, a BFA internally grades the extracted information (check nodes) into 4 bins—ranging across strong 0, weak 0, weak 1, and strong 1—each having a unique weight associated with it, referred to as bin weights. During the decoding operation, the BFA decoder computes the checksum of a bit node by summing the weights of the check nodes that are connected to the bit node. If the checksum is greater than a threshold, then the bit is flipped; otherwise the bit is retained in the same state.

During a typical BFA decoding process, the threshold is initially kept at a higher value in order to flip only those bits that are very likely to be in error; gradually, the threshold is decreased to promote flipping of bits in a graded manner until all the parity check equations are satisfied. Patterns of violated parity checks encountered during the BFA decoding process are used to weight the parity check equations, i.e. the syndrome-weights, to promote efficient and accurate decoding.

Current state-of-the-art tiered decoding designs have parameters that need careful tuning for optimal performance. For example, the tuning parameters for a typical decoding algorithm include the above-described bit flip threshold. The bit flip threshold determines when to flip a bit found likely to be in error because it exceeds the threshold.

The current tiered BFA decoding solutions use a look-up table to implement the function of deriving the bit flip threshold from the current syndrome-weight values, a laborious manual trial and error process. Moreover, because it is part of a tiered decoding design, BFA decoding typically requires retuning the bit flip threshold with every new LDPC matrix with which it is tiered. As a result, tuning BFA decoding is not only a potential project-schedule bottleneck, but poor or inadequate tuning can also risk sub-optimal decoding that fails to lower decoding latency or improve the bit-error rate performance, or reduce the probability of a mis-correct, i.e. a decoding error.

To overcome these challenges, embodiments of a self-configuring decoder herein described are designed to self-configure one or more tuning parameters at runtime so that a codeword is decoded with greater efficiency and accuracy than is typically achieved. Greater efficiency includes but is not limited to any one or more of lower decoding latency and increased bit-error rate performance, and greater accuracy includes but is not limited to a reduced probability of mis-corrects.

In one embodiment, greater efficiency further includes improvements in convergence. Decoding convergence refers to the point at which a codeword decoding process is considered complete, i.e. the error floor, where any further iterations would result in negligible improvement in the decoder's error performance. Improvements in convergence include any one or more of reduced average and peak decoding iteration counts to reach convergence.

In one embodiment, by analyzing the decoding process as a control problem, the principles of feedback control systems are advantageously used to build a decoder capable of self-configuring one or more tuning parameters, where the tuning parameters are derived from one or more control variables in the control problem.

A control system has three functional components that address the control problem. The functional components include a plant, which refers to the component that generates the output. Second there is controller, which controls the plant using a control variable. Finally, there is a feedback loop, also referred to as a control loop. During operation, the controller samples output from the plant via the feedback loop and varies the control variable such that any error in the output is reduced to zero or near-zero.

In one embodiment, as applied to a decoder, the plant functional component of the control system is the decoder itself and the output of the plant is the updated bit nodes of the codewords being decoded and the updated syndrome-weights associated with the decoding process. The controller is the functional component that enables the decoder to be self-configuring by varying tuning parameters of the decoder based on sampled output from the decoder via the feedback loop such that any error in the decoding process is reduced to zero or near-zero.

For ease of illustration, the embodiments now described refer to a self-configuring BFA decoder, but other types of decoders for error control coding that are capable of being modeled as a control system can be self-configured as described herein. For example, other non-binary flipping algorithms useful for decoding non-binary LDPC codes can also be self-configured using the embodiments described herein. For example, a non-binary LDPC code may be decoded using a min-sum decoder, which generates extrinsic information based on each check operation that can be mathematically modeled and parameterized for self-configured decoding using the above-described principles of feedback control systems.

In some embodiments, a self-configuring decoding process can be modeled using control systems other than those described herein and/or can be built to use control variables other than the control variables that correspond to the BFA tuning parameters already described, i.e. the bit flip threshold and the map of syndrome-weights to logic-strength variables.

In one embodiment a self-configuring decoding process for error control coding is mathematically modeled as a linear time-invariant control system having one or more control variables. With reference to a BFA decoder, the control variables that can be identified by modeling the BFA decoding process include, but are not limited to, control variables that correspond to the BFA tuning parameters already described, i.e. the bit flip threshold and the map of syndrome-weights to logic-strength variables. Thus, embodiments of a self-configuring BFA decoder self-configures any one or more of the bit flip threshold and a mapping of syndrome-weights to logic-strength values, or any other control variable identified in the modeled decoding process.

In one embodiment, a self-configuring BFA decoder is implemented as a closed-loop BFA decoder, in which a closed feedback loop, i.e. a control loop, is established between an output of the BFA decoder and a proportional-integral-differential (PID) controller, the PID controller functioning as a control loop feedback controller. The PID controller applies a correction to a PID controller variable over time based on proportional (P), integral (I), and derivative (D) terms. For example, in the context of the BFA decoder, the PID controller is configured to apply corrections to one or more PID controller variables corresponding to the one or more control variables identified by modeling the BFA decoding process, and to adjust the BFA tuning parameters accordingly, including the bit flip threshold and mapping of syndrome-weights to strength-logic values.

In one embodiment, the PID controller further computes any one or more PID controller constants based on current performance characteristics of the BFA decoding process, including the decoding latency, mis-correct probability and the bit-error rate performance. The PID controller constants influence the operation of the PID controller when it applies corrections to the PID controller variables over time based on current performance characteristics.

In one embodiment, the PID controller obtains, via the feedback loop, the output of the BFA decoder, the output including, for example, an updated syndrome-weight that represents a current weight associated a particular syndrome, the syndrome identifying any one of a number of patterns of violated parity checks encountered during the BFA decoding process.

In one embodiment, after the PID controller constants are computed and the output of the BFA decoder is received via the feedback loop, the PID controller is ready to apply corrections to the PID controller variables corresponding to the BFA tuning parameters. For example, the PID controller applies a correction to the updated syndrome-weight output from the BFA decoder in combination with the computed PID controller constants, and adjusts the bit flip threshold BFA parameter in accordance with the corrected syndrome-weight. In this manner, the BFA decoding process is self-configured with the adjusted bit flip threshold BFA tuning parameter in advance of decoding the next codeword.

In one embodiment, the PID controller can operate as any one or more of a continuous-time PID controller, in which correction of the PID controller variables and subsequent adjustment of the BFA tuning parameters occurs continuously over time, and a discrete-time PID controller, in which correction of the PID controller variables and subsequent adjustment of the BFA tuning parameters occurs at predetermined intervals of time or in response to a triggering event.

In some embodiments, the self-configuring BFA decoder enables dynamic trading of error floor performance for error rate performance and vice versa based on current performance characteristics. For example, in one embodiment, a self-configuring BFA decoder modifies a mapping of the updated syndrome-weight to logic-strength values from a first mapping to a second mapping based on the current performance characteristics of the BFA decoding process. The current performance characteristics can include the performance characteristics used to compute the any one or more PID controller constants, such as the current bit-error rate performance.

In the description that follows, examples may include subject matter such as a method, a process, a means for performing acts of the method or process, an apparatus, a memory device, and a system for a self-configuring decoder for error control coding, and at least one machine-readable tangible storage medium including instructions that, when performed by a machine or processor, cause the machine or processor to performs acts of the method or process according to embodiments and examples described herein Numerous specific details are set forth to provide a thorough explanation of embodiments of the methods, media and systems for providing a self-configured decoder for error control coding in a memory device. It will be apparent, however, to one skilled in the art, that an embodiment can be practiced without one or more of these specific details. In other instances, well-known components, structures, and techniques have not been shown in detail so as to not obscure the understanding of this description.

Reference in the specification to "one embodiment" or "an embodiment" means that a particular feature, structure, or characteristic described in connection with the embodiment can be included in at least one embodiment. The appearances of the phrase "in one embodiment" in various places in the specification do not necessarily all refer to the same embodiment.

The methods, processes and logic depicted in the figures that follow can comprise hardware (e.g. circuitry, dedicated logic, controllers, etc.), software (such as is run on a general-purpose computer system or a dedicated machine, e.g. a software module or logic), and interfaces (such as a memory interface) between hardware and software, or a combination of both. Although the processes and logic are described below in terms of some sequential operations, it should be appreciated that some of the operations described can be performed in a different order. Moreover, some operations can be performed in parallel rather than sequentially.

In any one or more of the embodiments of the systems, apparatuses and methods herein described, a self-configured decoder for error control coding includes a memory device having a memory controller, an error control code (ECC) circuit block in communication with the memory controller, the ECC circuit block including a decoder to decode codewords in accordance with a decoding algorithm, a control loop feedback controller, also referred to as a feedback controller, and a closed feedback loop established between an output of the decoder and the control loop feedback controller. Upon receiving the output of the decoder, the control loop feedback controller applies corrections to the most recent output, treating the most recent output as a controller variable. The control loop feedback controller subsequently adjusts one or more tuning parameters of the decoding algorithm to decode codewords based on the corrections applied to the most recent output of the decoder and current performance characteristics of the memory controller.

In any one or more of the embodiments of the systems, apparatuses and methods herein described, the decoding algorithm is a bit flip algorithm (BFA), the output of the BFA decoder is a syndrome-weight that represents a current weight associated with a pattern of violated parity checks encountered during decoding, and the one or more tuning parameters includes any one or more of a BFA threshold for determining when to flip a bit of a codeword during decoding and a mapping of the syndrome-weight to one or more BFA logic-strength values.

In any one or more of the embodiments of the systems, apparatuses and methods herein described, the tuning parameters adjusted by the PID controller are based on a mathematical model of the BFA having a bit-node update process in which a checksum is computed for each bit node of a codeword by summing up syndrome-weights and comparing the summed syndrome-weights against the BFA threshold to determine when to flip the bit node, and a syndrome-weight update process in which, upon completing the bit-node update process, a first syndrome-weight bit is used to record a syndrome and a second syndrome-weight bit is used to record a confidence in the syndrome-weight, the confidence in the syndrome-weight lowered if the bit node was flipped. In one embodiment, the mathematical model of the BFA identifies the one or more tuning parameters, including the any one or more of a BFA threshold for determining when to flip a bit of a codeword during the bit-node process and a mapping of the syndrome-weight to one or more BFA logic-strength values.

In any one or more of the embodiments of the systems, apparatuses and methods herein described, the control loop feedback controller is a proportional-integral-differential (PID) controller that applies a correction to a PID controller variable over time based on proportional (P), integral (I), and derivative (D) terms, the PID controller variable corresponding to any one or more of the tuning parameters of the decoding algorithm.

In any one or more of the embodiments of the systems, apparatuses and methods herein described, the PID controller is any one of a continuous time PID controller that applies corrections to PID controller variables continuously over time and a discrete time PID controller that applies corrections to PID controller variables at any one of predetermined intervals of time or in response to a triggering event.

In any one or more of the embodiments of the systems, apparatuses and methods herein described, the tuning parameters adjusted by the control loop feedback controller are based on a mathematical model of the decoding algorithm as a control system having one or more controller variables that correspond to the tuning parameters.

In any one or more of the embodiments of the systems, apparatuses and methods herein described, the mathematical mode is a linear time-invariant control system.

In any one or more of the embodiments of the systems, apparatuses and methods herein described, means for performing any one or more of the embodiments of the systems, apparatuses and methods for a self-configured decoder for error control coding in a memory device is herein described.

In any one or more of the embodiments of the systems, apparatuses and methods herein described, at least one computer-readable storage medium includes instructions that, when executed on one or more processors of a memory device cause the processor(s) to perform any one or more of the embodiments of the systems, apparatuses and methods for a self-configured decoder for error control coding herein described.

Figure 1:
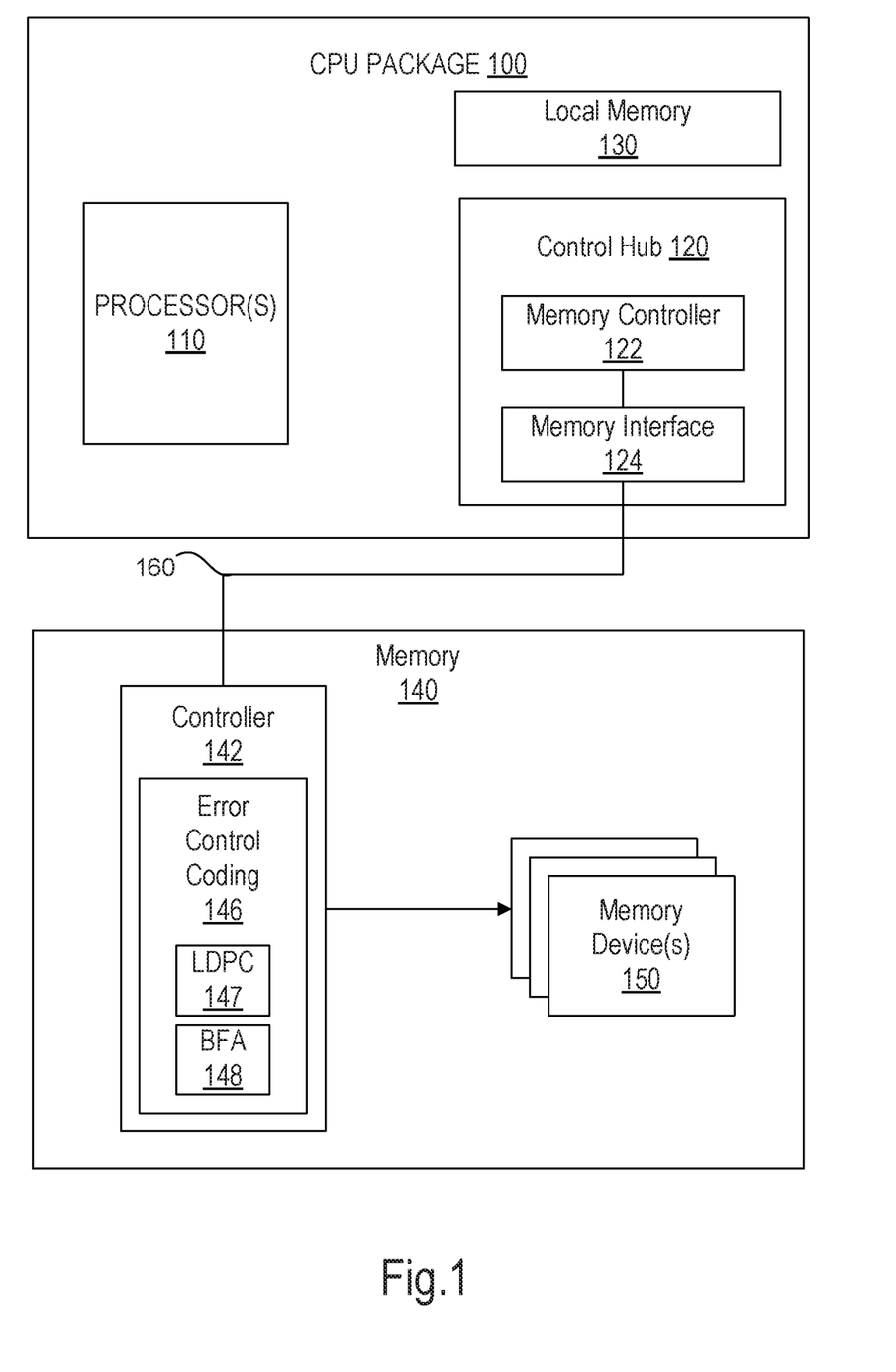
FIG. 1 is a schematic, block diagram illustration of components of apparatus to implement a self-configuring decoder to decode data encoded in non-volatile memory in accordance with various examples described herein.

FIG. 1 is a schematic, block diagram illustration of components of apparatus to implement a self-configured decoder for error control coding in a memory device in accordance with various examples described herein. Referring to FIG. 1, in some embodiments a central processing unit (CPU) package 100 comprises one or more processors 110 coupled to a control hub 120 and a local memory 130. Control hub 120 comprises a memory controller 122 and a memory interface 124.

Memory interface 124 is coupled to a remote memory 140 by a communication bus 160. In some embodiments, the communication bus 160 may be implemented as traces on a printed circuit board, a cable with copper wires, a fibre optic cable, a connecting socket, or a combination of the above. Memory 140 may comprise a controller 142 and one or more memory device(s) 150. In various embodiments, at least some of the memory devices 150 may be implemented using volatile memory, e.g., static random access memory (SRAM), a dynamic random access memory (DRAM). In one embodiment, the memory device is a block addressable memory device, such as those based on NAND or NOR technologies. In one embodiment, the memory device 150 may be implemented using non-volatile memory. In one embodiment, the nonvolatile memory may be byte or block addressable. The specific configuration of the memory device(s) 150 in the memory 140 is not critical.

A memory device may also include future generation nonvolatile devices, such as a three dimensional (3D) crosspoint memory device, or other byte addressable write-in-place nonvolatile memory devices. In some embodiments, 3D crosspoint memory may comprise a transistor-less stackable cross point architecture in which memory cells sit at the intersection of word lines and bit lines and are individually addressable, and in which bit storage is based on a change in bulk resistance.

In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric random-access memory (FeRAM), ferroelectric transistor random access memory (FeTRAM), anti-ferroelectric memory, nanowire-based non-volatile memory, memory that incorporates memristor technology, magnetoresistive random access memory (MRAM) memory that incorporates memristor technology, resistive memory including the metal oxide base, the oxygen vacancy base and the conductive bridge Random Access Memory (CB-RAM), spin-transfer torque memory (STT-RAM) or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product.

In some examples controller 142 may comprise, or be communicatively coupled to, an error control coding (ECC) module 146 configured with multiple tiers of decoding and encoding, such as an LDPC module 147 to encode and decode soft data (i.e., bits or symbols from a codeword) and a BFA module 148 to decode bits from a codeword.

Figure 2:
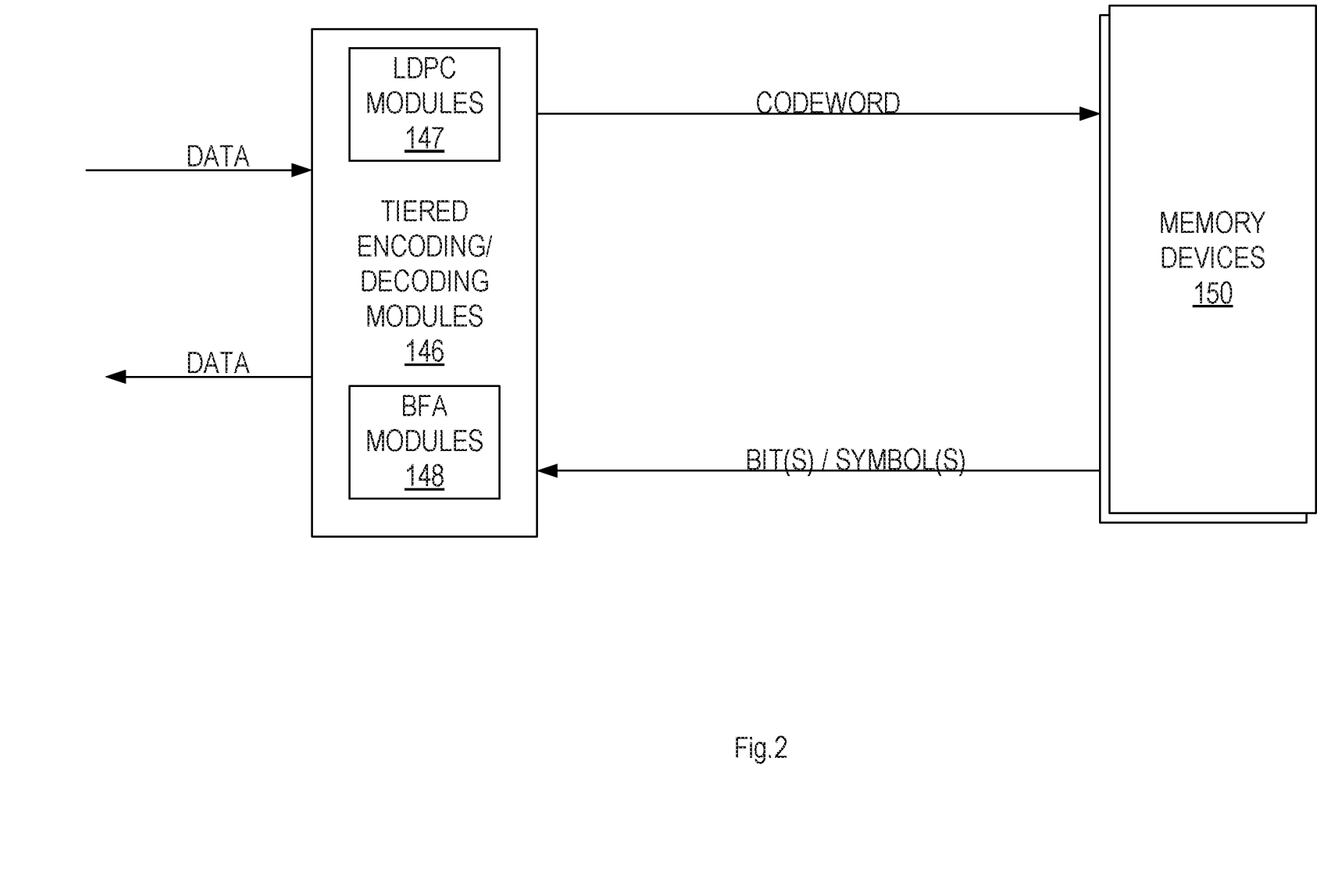
FIG. 2 is a schematic, block diagram illustration of a memory architecture to implement a self-configuring decoder to decode data encoded in non-volatile memory in accordance with various examples described herein.

FIG. 2 is a schematic, block diagram illustration of a memory architecture to implement a self-configured decoder in non-volatile memory in accordance with various examples discussed herein. Referring to FIG. 2, in some examples user data is input to an LDPC encoder 147, which encodes the user data into an LDPC codeword, which may be either a binary LDPC codeword or a non-binary LDPC codeword, and/or input to a BFA decoder 148, which decodes binary codewords to correct errors in the codewords, such as LDPC binary codewords, using a self-configuring BFA decoding process as will be described in detail below. The codeword may be stored in the memory device(s) 150. During error control coding the codeword may be retrieved from the memory devices as a plurality of symbols or as binary data.

Figure 3A:
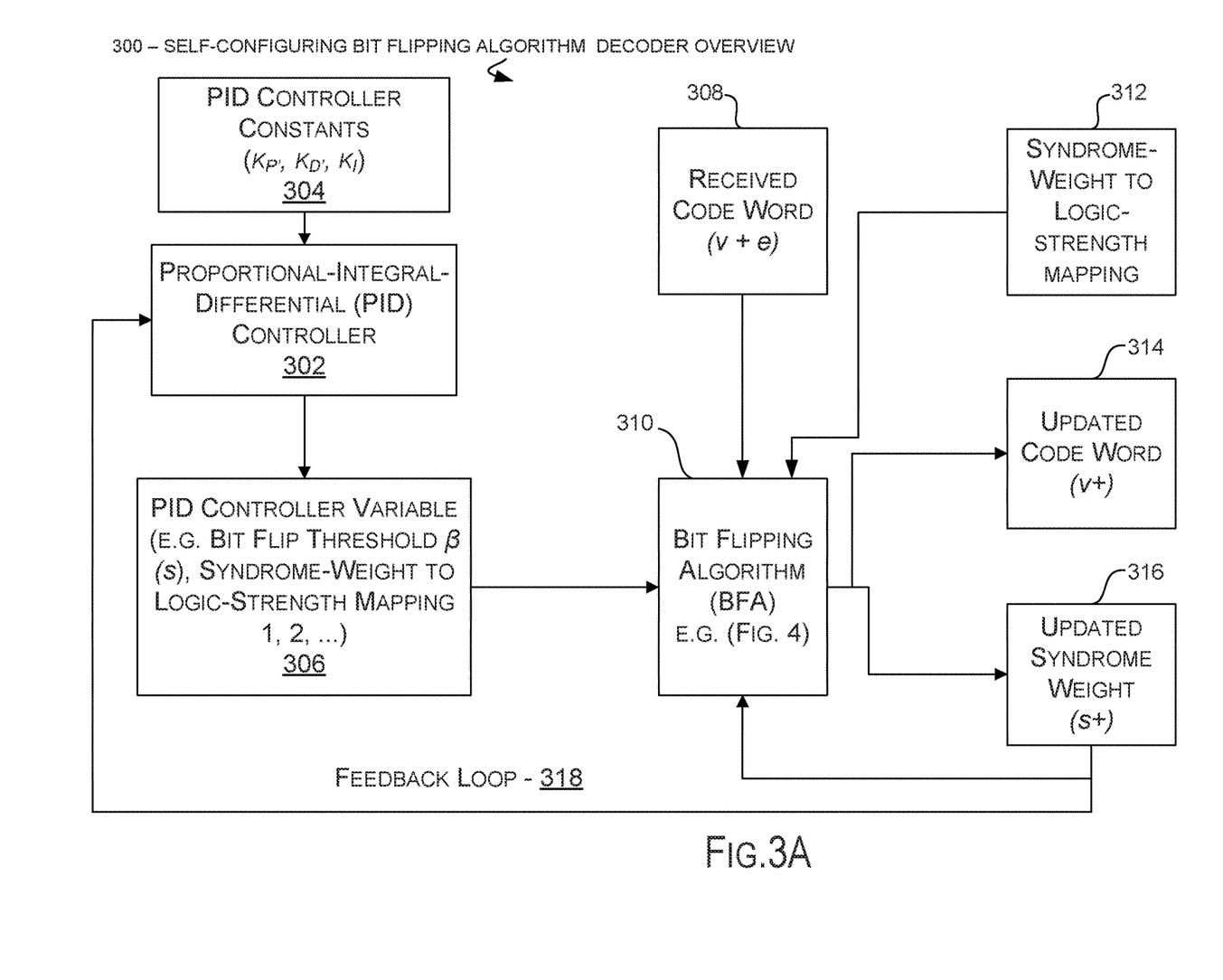
FIGS. 3A-3B are block diagrams illustrating an overview of one embodiment of a self-configuring decoder to decode data encoded in non-volatile memory in accordance with various examples described herein.
Figure 3B:
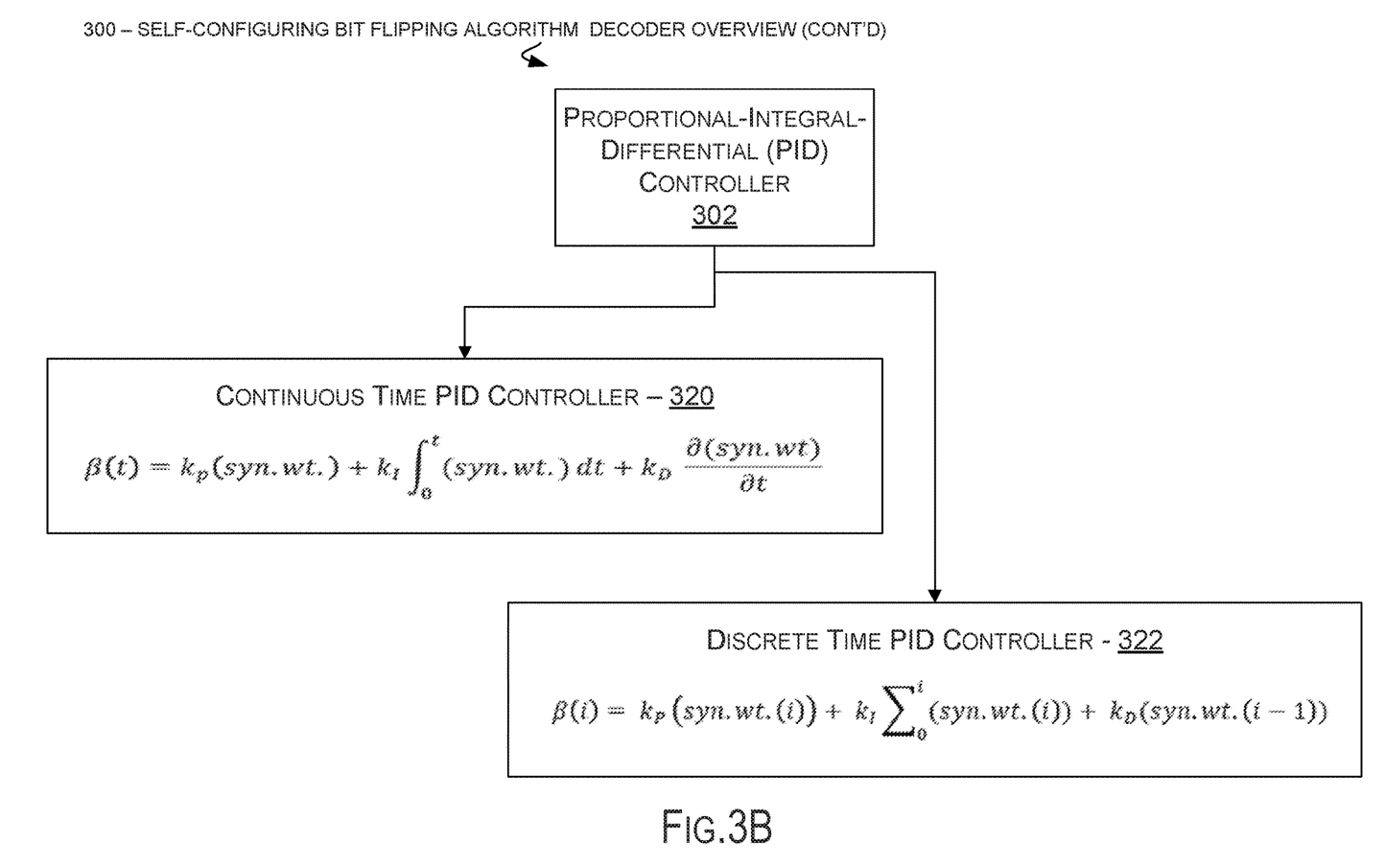

FIG. 3A-3B are block diagrams illustrating an overview 300 of one embodiment of a self-configuring decoder to decode data encoded in non-volatile memory in accordance with various examples described herein. As shown, the self-configured decoder 300 includes a decoding algorithm, such as the BFA algorithm 310, which receives a codeword (v+e) 308 after a read operation, where (v+e) represents the codeword plus memory errors such that the codeword may or may not satisfy the parity check equations used to decode the codeword. If the errors are within a tolerable limit, then the BFA algorithm uses the redundancies in the parity to recreate the original codeword (v) without the memory errors e, resulting in an updated codeword (v+) 314. During the BFA decoding process the BFA also generates an updated syndrome-weight (s+) 316. Operation of the BFA decoding process 310 depends in part on certain tuning parameters, such as the BFA threshold β and the current syndrome-weight to logic strength mapping 306, which can be automatically adjusted via a feedback loop 318 to the PID controller 302, which is described in more detail in FIG. 3B. The adjusted BFA threshold (β) determines when to flip bits in the codeword, and the adjusted mapping of syndrome-weights to logic-strength values 306 overrides the previous mapping 312, thereby enabling the BFA decoding process 310 to trade error floor performance for error rate performance during the decoding as needed to optimize the overall performance of the BFA decoder.

In one embodiment, operation of the PID controller 302 is configured based on PID controller constants 304, $K_P$, $K_D$ and $K_I$, where the PID controller 302 computes the constants based on current performance characteristics of the BFA decoding process, including the decoding latency, mis-correct probability and the bit-error rate performance. The PID controller constants influence the operation of the PID controller to apply corrections to the PID controller variables over time based on current performance characteristics.

FIG. 3B illustrates the PID controller in further detail. As illustrated, the PID controller 302 includes two variants, a continuous-time PID controller 320 continuous-time PID controller, in which application of corrections to the PID controller variables and adjustments of the BFA tuning parameters occurs continuously over time, and a discrete-time PID controller 322, in which application of corrections to the PID controller variables and adjustments of the BFA tuning parameters occurs at predetermined intervals of time or in response to a triggering event.

In one embodiment, the continuous-time PID controller 320 computes adjustments to the BFA flip threshold using the following equation:

$$\beta(t) = k_P(syn.wt.) + k_I \int_0^t (syn.wt.)dt + k_D \frac{\partial(syn.wt)}{\partial t}$$

where t is the time of decoding, β(t) is the adjusted bit flip threshold and syn.wt. is the current syndrome-weight value s+ 316 obtained as output from the BFA decoder 310 via the feedback loop 318. Recall that a syndrome refers to a parity check equation, and any one of a number of patterns of violated parity checks encountered during a decoding process, such as the BFA decoding processes are used to weight the parity check equation, referred to as a syndrome-weight. The syndrome-weight, or syn.wt., is a two-bit value where the first bit records the weight of the syndrome and the second bit records the confidence level of the syndrome.

In one embodiment, a discrete-time PID controller 322 computes adjustments to the BFA flip threshold using the following equation:

$$\beta(i)=k_P(\text{syn.wt.}(i))+k_I\Sigma_0^i(\text{syn.wt.}(i))+k_D(\text{syn.wt.}(i-1))$$

where i represents the decoding time interval, $\beta(i)$ is the adjusted bit flip threshold and syn.wt. is the current syndrome-weight value s+ 316 obtained from the BFA decoder 310 via the feedback loop 318.

Figure 4:
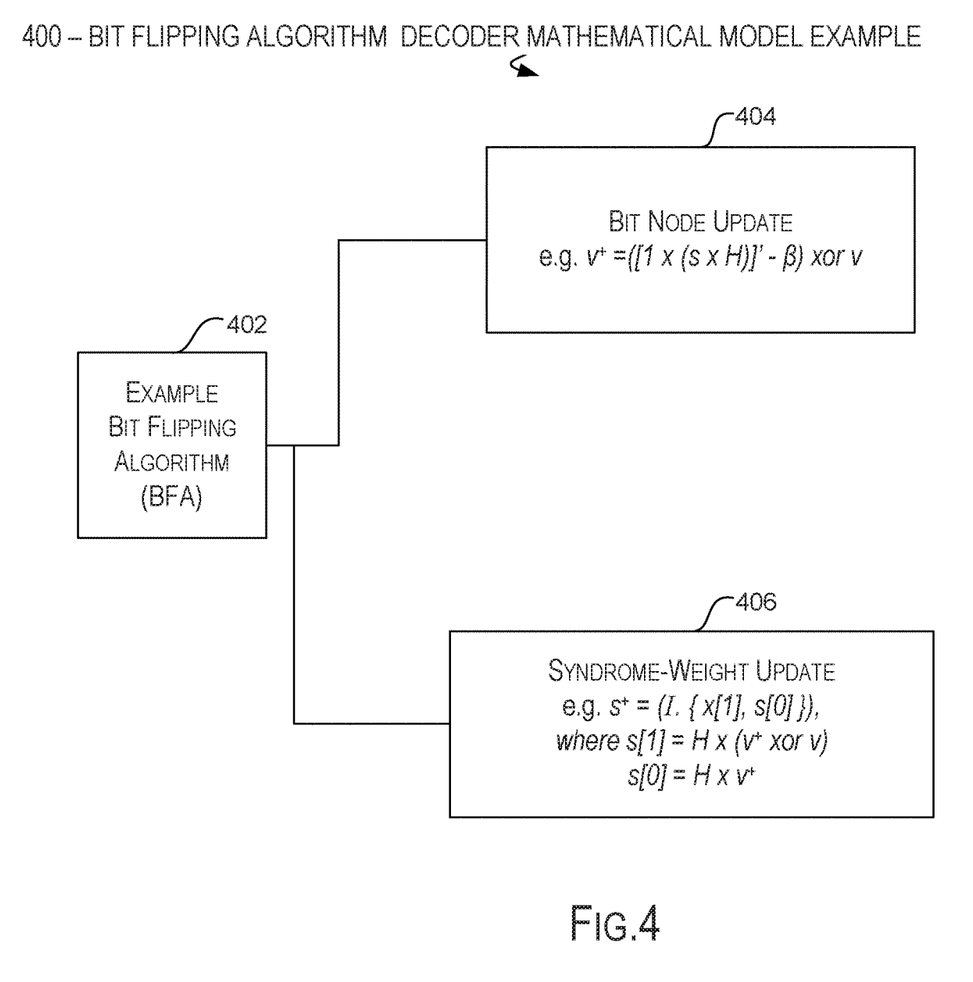
FIG. 4 is a block diagram illustrating an example of a mathematical model that can be used in accordance with one embodiment of a self-configuring decoder to decode data encoded in non-volatile memory in accordance with various examples described herein.

FIG. 4 is a block diagram illustrating an example of a BFA mathematical model 400 that can be used in accordance with one embodiment of a self-configuring BFA to decode data encoded in non-volatile memory in accordance with various examples described herein.

As illustrated, the behavior of an example bit-flipping algorithm 402 can be modeled in two stages, a bit node update stage 404, also referred to as the summation stage, and a syndrome-weight-update stage 406.

In the bit node update stage 404, or summation stage, a checksum (a real number and not binary) is computed for each bit node in a received codeword by summing up the syndrome-weights (again, this is a real number and not binary). The checksum is then compared against a threshold vector $\beta$, a column vector of size n. If the checksum corresponding to a bit node is greater than the threshold value corresponding to that bit node, the bit node is flipped, otherwise the bit node is retained as it is. A threshold function $f(x)=(x>0)?\ 1:0$ models this behavior resulting in the following equation representing the summation stage of updating the bit nodes:

$$v^+=[1\times(s\times H)]'-\beta xor\ v$$

where v+ is the updated bit, v is the input bit, H is the parity check matrix, and s is the syndrome-weight diagonal matrix, and 1 is a column vector of all 1's.

In the second syndrome-weight update stage 406, the syndrome is a two-bit value {00, 01, 10, 11} which corresponds to strong 0, weak 0, weak 1, and strong 1, and by default maps to logic-strength values from 0 to 3 respectively. As previously described, the first position of the syndrome-weight bits records the syndrome after updating the bit nodes and the second position of the syndrome-weight bit records the confidence of the syndrome-weight. If any of the bit nodes connected to a check node is flipped in the current iteration, then the confidence recorded in the second position of the syndrome-weight bit is lowered. This stage can be modeled using the following three equations:

$$s[1]=H\times(v^+xor\ v)$$

$$s[0]=H\times v^+$$

$$s^+=I\cdot\{s[1],s[0]\}$$

where $s^+$ represents the diagonalizing of the syndrome-weight matrix s, v+ represents the updated bit, v represents the input bit, H represents the parity check matrix, and 1 is a column vector of all 1's.

Using example matrix values:

$$H=\begin{matrix}1&1&1\\0&1&1\end{matrix},$$

$$s=\begin{matrix}3&0\\0&1\end{matrix},$$

$$\beta=\begin{matrix}2\\2\\2\end{matrix},$$

$$v=\begin{matrix}1\\1\\0\end{matrix}$$

the iterations of the BFA decoder illustrated in FIG. 4 results in an updated bit node column vector $$v^+=\begin{matrix}0\\0\\1\end{matrix}$$

and an updated syndrome-weight matrix, $$s^+=\begin{matrix}2&0\\0&1\end{matrix},$$

which satisfies the parity check equation indicating the end of the decoding process.

Figure 5A:
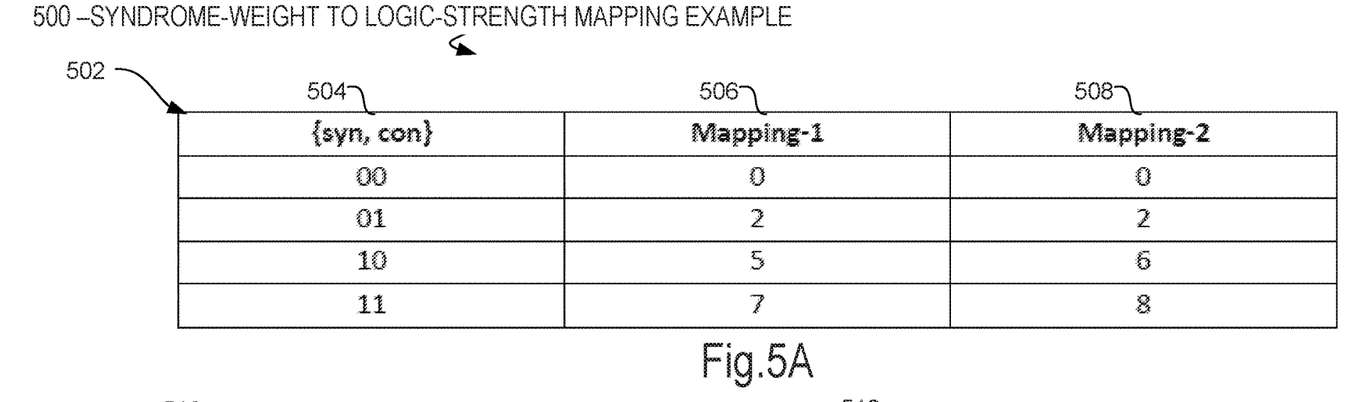
FIGS. 5A-5C illustrate an example of mapping syndrome-weights to logic-strength values that can be used in accordance with one embodiment of a self-configuring decoder to decode data encoded in non-volatile memory in accordance with various examples described herein.
Figure 5B:
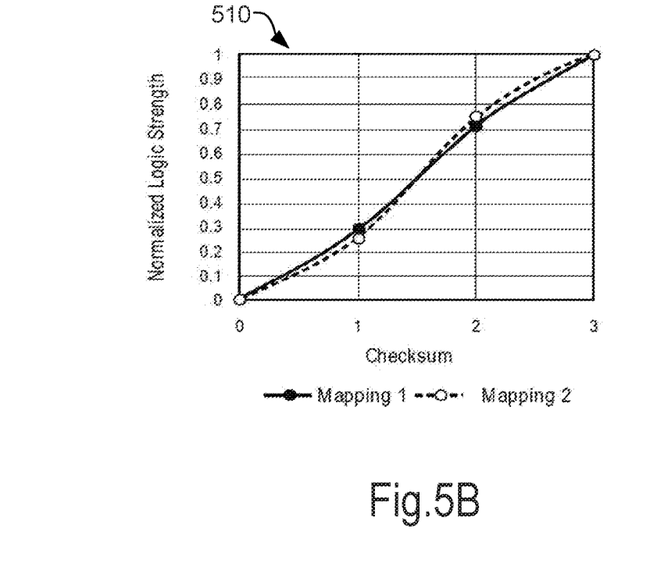
Figure 5C:
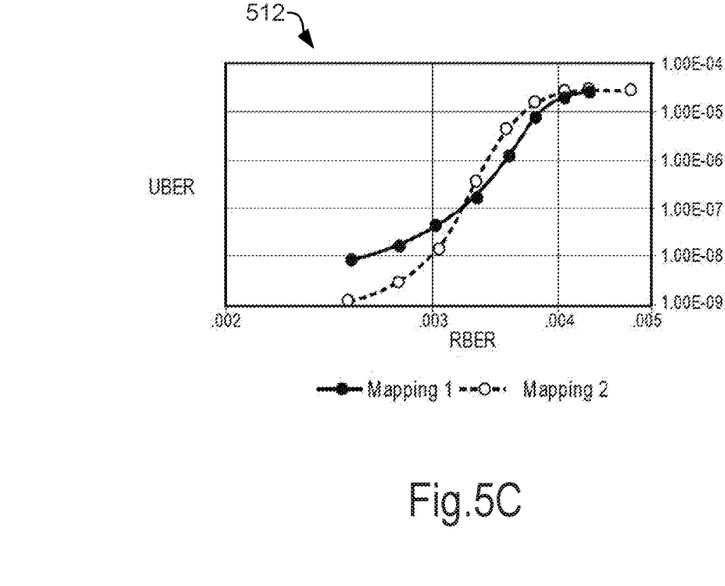

FIGS. 5A-5C illustrate an example 500 of mapping syndrome-weights to logic-strength values that can be used in accordance with one embodiment of a self-configuring BFA to decode data encoded in non-volatile memory in accordance with various examples described herein.

In one embodiment, the determination of which mapping to use depends on the performance characteristics of the decoding process, such as the decoding latency, mis-correct probability and the bit-error rate performance. Using the equation representing the summation stage (FIG. 4, 404), of updating the bit nodes, $$v^+=[1\times(s\times H)]'-\beta xor\ v$$

the value of s, the syndrome-weight diagonal matrix, defaults to a syndrome-weight of {strong 0, weak 0, weak 1, strong 1} mapping to strength-logic values {0, 1, 2, 3} respectively as previously described. In one embodiment, modifying the default mapping tunes the BFA decoding process by trading the error-rate performance for error-floor performance, or vice versa.

As illustrated in FIG. 5A, exemplary mappings 502 of a syndrome-weight, composed of a syndrome and a confidence bit {syn, con} 504, can be mapped to logic-strength values using one of two different mappings, Mapping-1 506, with logic-strength values {0, 2, 5, 7}, and Mapping-2 508, with logic-strength values {0, 2, 6, 8}. Thus, a syndrome-weight two-bit value of {0,0} maps to the same logic-strength value 0 using either mapping, whereas a syndrome-weight two-bit value {1,0} maps to the logic-strength value 5 for Mapping-1 506, but to a different logic-strength value 6 for Mapping-2 508. It should be noted that the illustration of two mappings is for ease of illustration only; embodiments of a self-configuring decoder can employ additional mappings with different logic-strength values as well.

In one embodiment, the effect of modifying the mapping is illustrated in graph 510 of FIG. 5B and graph 512 of 5C. With reference to FIG. 5B, the logic-strength values {0, 2, 5, 7} and {0, 2, 6, 8} are normalized to a 0-1 range as shown in the y-axis of graph 510. The checksums derived from codewords are represented in the x-axis of chart 510 with values ranging from 0 to 3. Each checksum is mapped to a normalized logic-strength value using one of the above-described exemplary mappings, Mapping-1 and Mapping-2.

In one embodiment, with reference to FIG. 5C, the effects of modifying the mapping on different codeword data traffic is illustrated in graph 512. For example, when using Mapping-1 for a non-linear mapping of syndrome-weights to logic strength, better uncorrectable bit error rates (UBER) are achieved for codeword data traffic with raw bit error rates (RBER) above 0.003 albeit with a higher error floor, ranging from approximately 1.00 E-08 to 1.00 E-05 UBER, where RBER and UBER are expressed as a ratio of erroneous bits to the transmitted bits. In contrast, when using Mapping 2 for a non-linear mapping of syndrome-weights to logic strength, a lower error floor UBER of 1.00 E-09 is achieved, but at the cost of a higher overall error rate, with higher UBERs for codeword data traffic with RBERs above 0.003.

Figure 6:
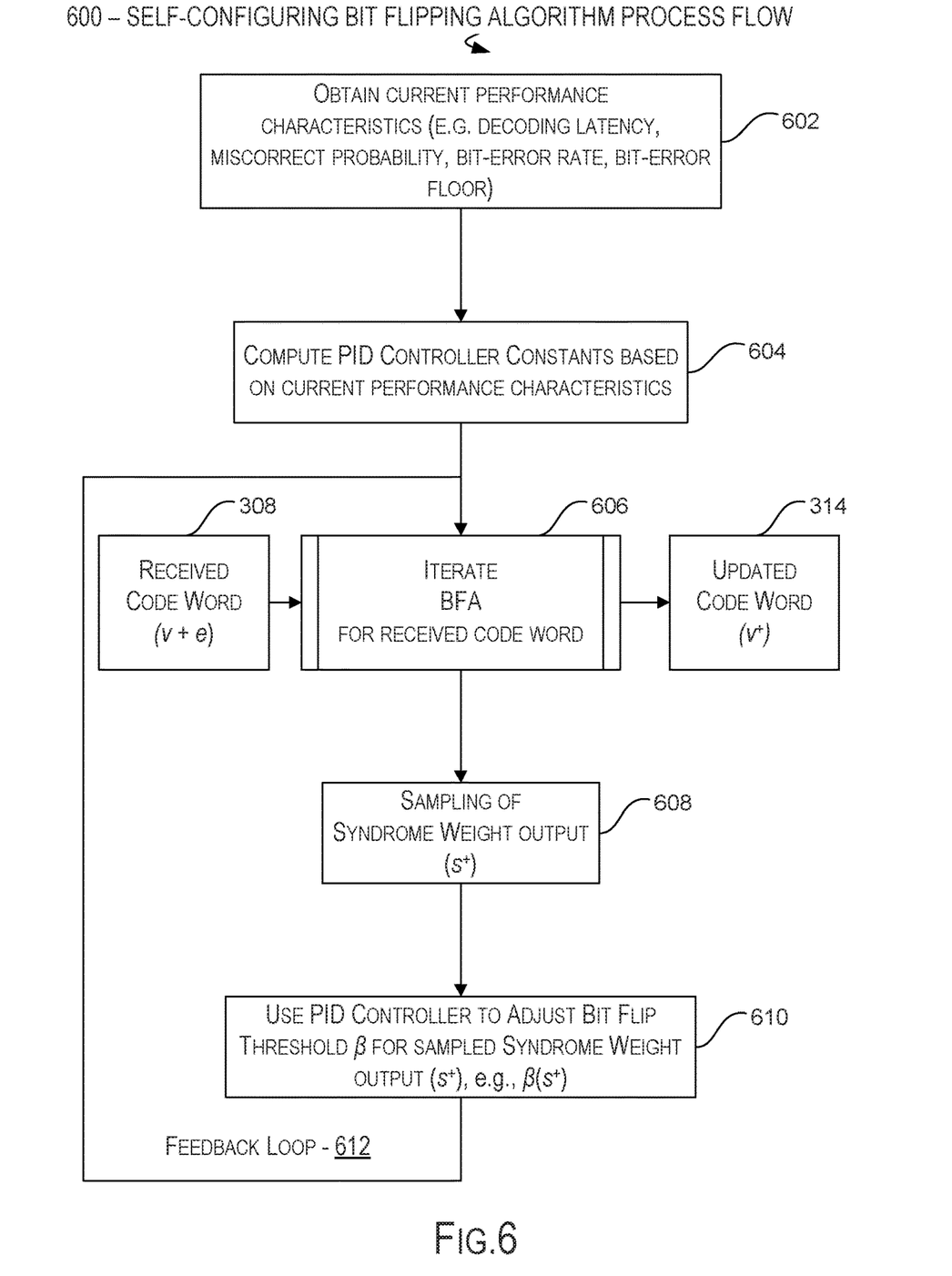
FIG. 6 is a flow diagram illustrating embodiments of processes performed to implement a self-configuring decoder to decode data encoded in non-volatile memory in accordance with various examples described herein.

FIG. 6 is a flow diagram illustrating embodiments of processes 600 performed to implement a self-configuring decoder to decode data encoded in non-volatile memory in accordance with various examples described herein.

In one embodiment, at process 602 a self-configuring decoder obtains current performance characteristics of the decoding process as performed in a memory device. In one embodiment, the performance characteristics include but are not limited to the decoding latency, mis-correct probability, bit-error rate and bit-error floor. At process 604, the self-configuring decoder computes PID controller constants $K_P$, $K_D$ and $K_I$, based on the current performance characteristics in preparation for commencing self-configuration of tuning parameters for tuning the performance of the decoding process as performed in a memory device.

At process 606, the self-configuring decoder establishes a closed feedback loop 612 between the decoder and a PID controller for adjusting tuning parameters for the decoding process, and commences iteration of the decoding algorithm, such as BFA, upon the received code word (v+e). Upon completion of the iterations, the self-configuring decoder outputs the updated code word (v+). During the iterations, the decoding algorithm generates updated syndrome-weights (s+) at 608. At process 610 the self-configuring decoder obtains one or more samples of the syndrome-weight outputs 608 via the feedback loop 612 and adjusts one or more tuning parameters for decoding, including deriving an adjusted BFA threshold for the sampled syndrome-weights $\beta(s^+)$. The process 600 repeats throughout the decoding process until all codewords have been decoded.

Figure 7:
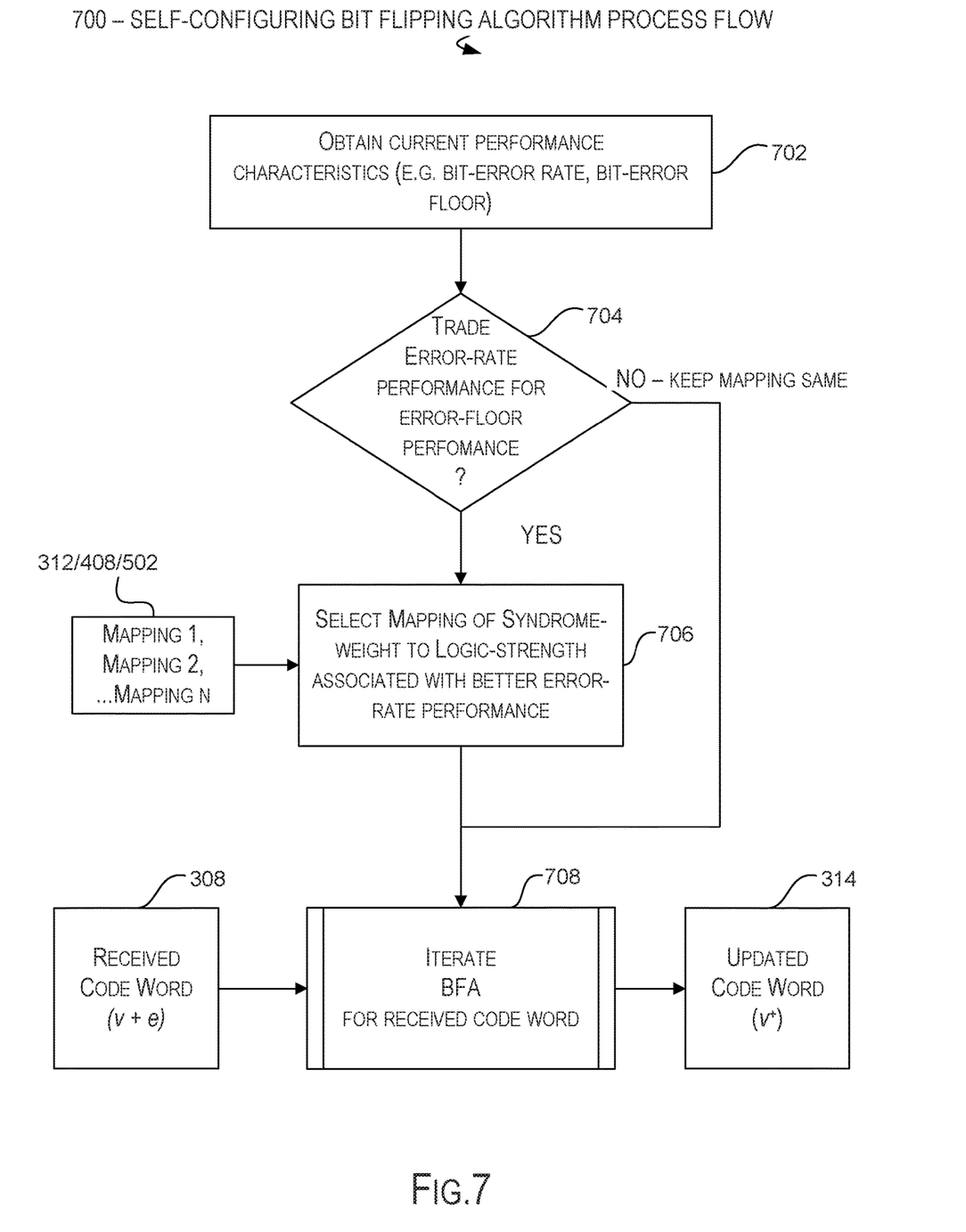
FIG. 7 is a flow diagram illustrating embodiments of processes performed to implement a self-configuring decoder to decode data encoded in non-volatile memory in accordance with various examples described herein.

FIG. 7 is a flow diagram illustrating embodiments of processes 700 performed to implement a self-configuring decoder to decode data encoded in non-volatile memory in accordance with various examples described herein.

In one embodiment, at process 702 a self-configuring decoder obtains current performance characteristics of the decoding process as performed in a memory device. As described with reference to FIG. 6, in one embodiment, the performance characteristics include but are not limited to the decoding latency, mis-correct probability, bit-error rate and bit-error floor. At decision block 704, the self-configuring decoder determines whether to trade error-rate performance for error-floor performance. The determination depends on any one or more of the current performance characteristics and/or a type of codeword data traffic, such as low-RBER data versus high-RBER data.

Should the determination at 704 indicate a new mapping is to be selected, then at process 706, the self-configuring decoder proceeds to select a mapping of syndrome-weight to logic strength associated with better error-rate performance or, vice versa, one associated with better error-floor performance based on the determination at 704.

In one embodiment the selection of mappings is from a list of mappings, (e.g., mapping 1, mapping 2, ... mapping n (312, FIG. 3, 408, FIG. 4, 502, FIG. 5) stored in memory for this purpose. Upon completing the selection, at process 708, the self-configuring decoder commences iteration of the decoding algorithm, such as BFA, upon the received code word (v+e). Upon completion of the iterations, the self-configuring decoder outputs the updated code word (v+) 314.

In one embodiment, the logic of process 700 to modify the mapping of the updated syndrome-weight to logic-strength values can be integrated into the PID controller and controller feedback loop logic 610/612 based on the performance characteristics constants computed by the PID controller in preparation for self-configuring the decoding process.

Figure 8:
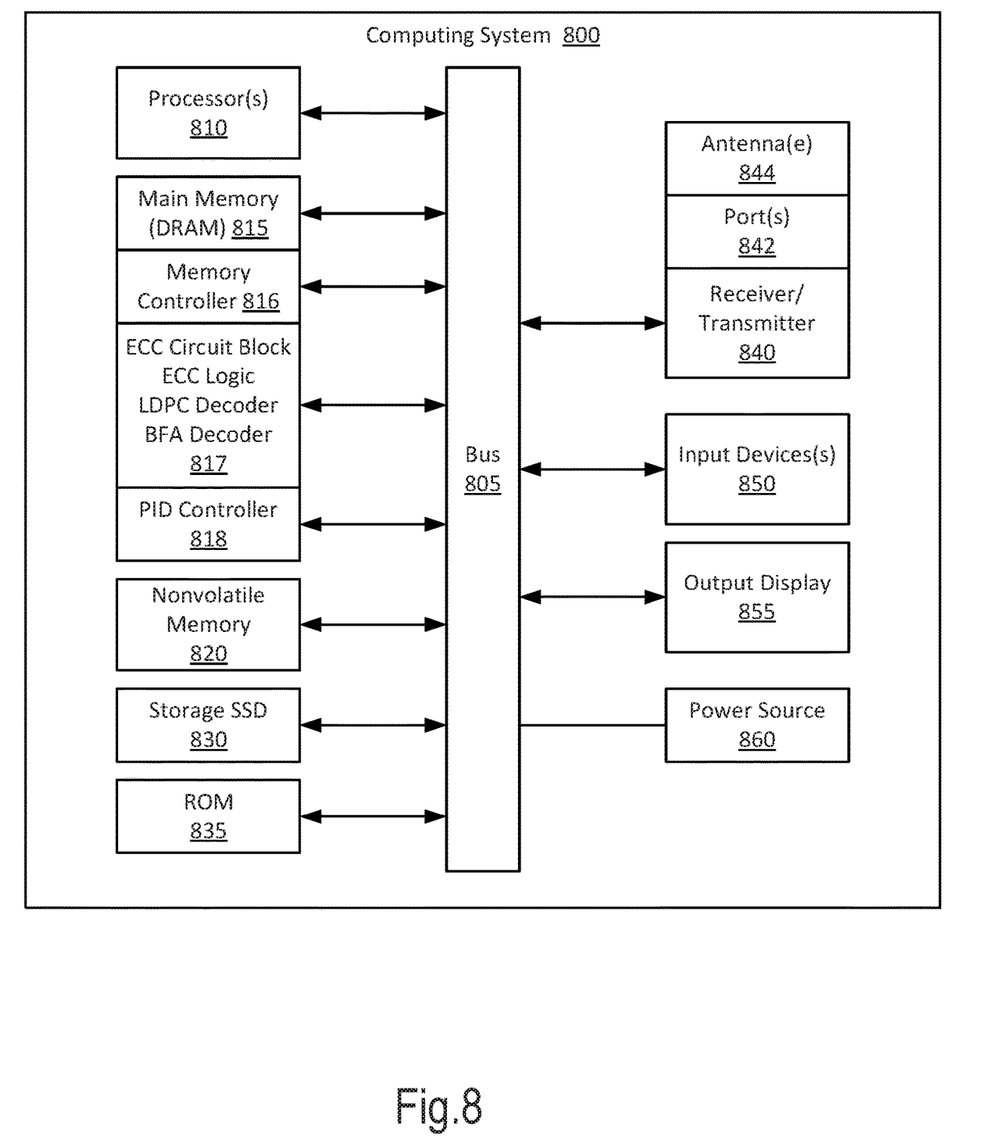
FIG. 8 illustrates an example of a typical computer system in which embodiments of a self-configuring decoder to decode data encoded in non-volatile memory could be implemented, either in whole or in part, in accordance with various examples described herein.

FIG. 8 is an illustration of a system including memory for a tiered decoding logic for ECC circuit block, including, for example, an LDPC encoder tiered with a self-configuring BFA decoder according to an embodiment. In this illustration, certain standard and well-known components that are not germane to the present description are not shown. Elements shown as separate elements may be combined, including, for example, a SoC (System on Chip) combining multiple elements on a single chip.

In some embodiments, a computing system 800 may include a processing means such as one or more processors 810 coupled to one or more buses or interconnects, shown in general as bus 805. The processors 810 may comprise one or more physical processors and one or more logical processors. In some embodiments, the processors may include one or more general-purpose processors or special-purpose processors.

The bus 805 is a communication means for transmission of data. The bus 805 is illustrated as a single bus for simplicity, but may represent multiple different interconnects or buses and the component connections to such interconnects or buses may vary. The bus 805 shown in FIG. 8 is an abstraction that represents any one or more separate physical buses, point-to-point connections, or both connected by appropriate bridges, adapters, or controllers.

In some embodiments, the computing system 800 further comprises a random access memory (RAM) or other dynamic storage device or element as a main memory 815 and memory controller 816 for storing information and instructions to be executed by the processors 810. Main memory 815 may include, but is not limited to, dynamic random access memory (DRAM). In some embodiments, the RAM or other dynamic storage device or element includes a tiered ECC circuit block implementing an ECC circuit logic 817 to provide multiple tiers of decoders, including, for example, an LDPC decoder and a BFA decoder for decoding low RBER and high RBER data. In one embodiment, the RAM or other dynamic storage device or element includes a PID controller 818, such as the above-described PID controllers 302/320/322 of FIG. 3, where the PID controller 818 facilitates self-configuration of tuning parameters of one or more decoders provided in the ECC circuit block 817, such as the BFA decoder.

The computing system 800 also may comprise a non-volatile memory 820; a storage device such as a solid-state drive (SSD) 830; and a read only memory (ROM) 835 or other static storage device for storing static information and instructions for the processors 810.

In some embodiments, the computing system 800 includes one or more transmitters or receivers 840 coupled to the bus 805. In some embodiments, the computing system 800 may include one or more antennae 844, such as dipole or monopole antennae, for the transmission and reception of data via wireless communication using a wireless transmitter, receiver, or both, and one or more ports 842 for the transmission and reception of data via wired communications. Wireless communication includes, but is not limited to, Wi-Fi, Bluetooth™, near field communication, and other wireless communication standards.

In some embodiments, computing system 800 includes one or more input devices 850 for the input of data, including hard and soft buttons, a joy stick, a mouse or other pointing device, a keyboard, voice command system, or gesture recognition system.

In some embodiments, computing system 800 includes an output display 855, where the output display 855 may include a liquid crystal display (LCD) or any other display technology, for displaying information or content to a user. In some environments, the output display 855 may include a touch-screen that is also utilized as at least a part of an input device 850. Output display 855 may further include audio output, including one or more speakers, audio output jacks, or other audio, and other output to the user.

The computing system 800 may also comprise a battery or other power source 860, which may include a solar cell, a fuel cell, a charged capacitor, near field inductive coupling, or other system or device for providing or generating power in the computing system 800. The power provided by the power source 860 may be distributed as required to elements of the computing system 800.

It will be apparent from this description that aspects of the described embodiments could be implemented, at least in part, in software. That is, the techniques and methods described herein could be carried out in a data processing system in response to its processor executing a sequence of instructions contained in a tangible, non-transitory memory such as the memory 815 or the non-volatile memory 820 or a combination of such memories, and each of these memories is a form of a machine readable, tangible storage medium.

Hardwired circuitry could be used in combination with software instructions to implement the various embodiments. For example, aspects of the described embodiments can be implemented as software installed and stored in a persistent storage device, which can be loaded and executed in a memory by a processor (not shown) to carry out the processes or operations described throughout this application. Alternatively, the described embodiments can be implemented at least in part as executable code programmed or embedded into dedicated hardware such as an integrated circuit (e.g., an application specific IC or ASIC), a digital signal processor (DSP), a field programmable gate array (FPGA), or controller which can be accessed via a corresponding driver and/or operating system from an application. Furthermore, the described embodiments can be implemented at least in part as specific hardware logic in a processor or processor core as part of an instruction set accessible by a software component via one or more specific instructions.

Thus the techniques are not limited to any specific combination of hardware circuitry and software or to any particular source for the instructions executed by the data processing system.

All or a portion of the described embodiments can be implemented with logic circuitry, such as the above-described ASIC, DSP or FPGA circuitry, including a dedicated logic circuit, controller or microcontroller, or other form of processing core that executes program code instructions. Thus processes taught by the discussion above could be performed with program code such as machine-executable instructions that cause a machine that executes these instructions to perform certain functions. In this context, a "machine" is typically a machine that converts intermediate form (or "abstract") instructions into processor specific instructions (e.g. an abstract execution environment such as a "virtual machine" (e.g. a Java Virtual Machine), an interpreter, a Common Language Runtime, a high-level language virtual machine, etc.), and/or, electronic circuitry disposed on a semiconductor chip (e.g. "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

An article of manufacture can be used to store program code. An article of manufacture that stores program code can be embodied as, but is not limited to, one or more memories (e.g. one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g. a server) to a requesting computer (e.g. a client) by way of data signals embodied in a propagation medium (e.g. via a communication link (e.g. a network connection)).

The term "memory" as used herein is intended to encompass all volatile storage media, such as dynamic random access memory (DRAM) and static RAM (SRAM) or other types of memory described elsewhere in this application. Computer-executable instructions can be stored on non-volatile storage devices, such as magnetic hard disk, an optical disk, and are typically written, by a direct memory access process, into memory during execution of software by a processor. One of skill in the art will immediately recognize that the term "machine-readable storage medium" includes any type of volatile or non-volatile storage device that is accessible by a processor.

The preceding detailed descriptions are presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The described embodiments also relate to an apparatus for performing the operations described herein. This apparatus can be specially constructed for the required purpose, or it may comprise a general-purpose computer selectively activated or reconfigured by a computer program stored in the computer. Either way, the apparatus provides the means for carrying out the operations described herein. The computer program can be stored in a computer readable storage medium, such as, but is not limited to, any type of disk including floppy disks, optical disks, CD-ROMs, and magnetic-optical disks, read-only memories (ROMs), RAMs, EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems can be used with programs in accordance with the teachings herein, or it may prove convenient to construct a more specialized apparatus to perform the operations described. The required structure for a variety of these systems will be evident from the description provided in this application. In addition, the embodiments are not described with reference to any particular programming language. It will be appreciated that a variety of programming languages could be used to implement the teachings of the embodiments as described herein.

In the foregoing specification, embodiments have been described with reference to specific exemplary embodiments. It will be evident that various modifications could be made to the described embodiments without departing from the broader spirit and scope of the embodiments as set forth in the following claims. The specification and drawings are, accordingly, to be regarded in an illustrative sense rather than a restrictive sense.

What is claimed is:

1. A memory device comprising:
   a memory controller;
   an error control code (ECC) circuit block in communication with the memory controller, the ECC circuit block including:
      a decoder logic circuitry to decode codewords in accordance with a decoding algorithm,
      a feedback controller logic circuitry, and
      a closed feedback loop established between the decoder logic circuitry and the feedback controller logic circuitry; and
   wherein, responsive to receipt of an output of the decoder logic circuitry via the closed feedback loop, the feedback controller logic circuitry to adjust one or more tuning parameters of the decoding algorithm based on any one or more of the output of the decoder logic circuitry received via the closed feedback loop and a current performance characteristic of a decoding process to decode the codewords performed by the decoder logic circuitry,
   wherein the feedback controller logic circuitry is a proportional-integral-differential (PID) controller that applies a correction to a PID controller variable over time based on proportional (P), integral (I), and derivative (D) terms, the PID controller variable corresponding to any one or more of the tuning parameters of the decoding algorithm.

2. The memory device of claim 1, wherein:
   the decoding algorithm is a bit flip algorithm (BFA);
   the output of the decoder logic circuitry is a syndrome-weight used in the BFA that represents a current weight associated with a pattern of violated parity checks encountered during decoding; and
   the one or more tuning parameters of the BFA includes any one or more of:
      a BFA threshold for determining when to flip a bit of a codeword during decoding, and
      a mapping of the syndrome-weight to one or more BFA logic-strength values.

3. The memory device of claim 2, wherein the tuning parameters for which the feedback controller logic circuitry is to adjust are based on a mathematical model of the BFA that models:
   a bit-node update process configured to compute a checksum for each bit node of a codeword, including to sum syndrome-weights and to compare the summed syndrome-weights against the BFA threshold to determine when to flip the bit node; and
   a syndrome-weight update process configured to, upon completing the bit-node update process, record a syndrome in a first syndrome-weight bit and record a confidence in the syndrome-weight in a second syndrome-weight bit, the confidence in the syndrome-weight lowered if the bit node was flipped.

4. The memory device of claim 1, wherein the PID controller is any one of a continuous time PID controller that applies corrections to PID controller variables continuously over time and a discrete time PID controller that applies corrections to PID controller variables at any one of predetermined intervals of time or in response to a triggering event.

5. The memory device of claim 1, wherein the tuning parameters adjusted by the feedback controller circuitry logic are based on a mathematical model of the decoding algorithm as a control system having one or more control variables that correspond to the tuning parameters of the decoding algorithm.

6. The memory device of claim 5, wherein the mathematical model is a linear time-invariant control system.

7. A method for self-configuring error control coding comprising:
   receiving a performance characteristic of a memory device, the performance characteristic associated with a decoding process to decode codewords performed by a decoder of an error control coding (ECC) logic to control errors in data encoded in the memory device;
   establishing a closed feedback loop with the decoder of the ECC logic, the decoder decoding data encoded in the memory device in the presence of errors in accordance with a decoding algorithm;
   processing an output of the decoder obtained via the closed feedback loop in accordance with the performance characteristic, wherein processing the output of the decoder obtained via the closed feedback loop in accordance with the performance characteristic includes:

configuring a proportional-integral-differential (PID) controller with the performance characteristic; and causing the PID controller to process the output as a PID controller variable, including applying a correction to the output of the decoder over time; and adjusting a tuning parameter for tuning the decoding algorithm over time based on the processing of the output.

8. The method of claim 7, wherein:

the decoding algorithm is a binary decoding algorithm, including a bit flip algorithm (BFA); and the output is a syndrome-weight that represents a current weight associated with a pattern of violated parity checks the decoder encountered while decoding data using the BFA and the tuning parameter is a bit flip threshold for determining when to flip a bit of a codeword during decoding, the bit flip threshold derived from the syndrome-weight.

9. The method of claim 8, wherein the tuning parameter is a mapping between the syndrome-weight and a logic-strength value, the mapping capable of trading error-rate performance for error-floor performance, and vice versa, while decoding data using the BFA.

10. The method of claim 7, wherein the tuning parameter for tuning the decoder is based on a mathematical model of the BFA modeling:

a bit-node update process in which a checksum is computed for each bit node of a codeword by summing up syndrome-weights and comparing the summed syndrome-weights against the BFA threshold to determine when to flip the bit node, and a syndrome-weight update process in which, upon completing the bit-node update process, a first syndrome-weight bit is used to record a syndrome and a second syndrome-weight bit is used to record a confidence in the syndrome-weight, the confidence in the syndrome-weight lowered if the bit node was flipped; and further wherein the mathematical model of the BFA identifies control variables capable of output via the closed feedback loop for adjusting the one or more tuning parameters.

11. The method of claim 7, wherein the PID controller is any one of a continuous time PID controller that processes the output as a PID controller variable continuously over time and a discrete time PID controller that processes the output as a PID controller variable at any one of predetermined intervals of time or in response to a triggering event.

12. The method of claim 7, wherein the PID controller is based on a mathematical model of the decoding algorithm as a control system having one or more PID controller variables that correspond to the tuning parameters of the decoding algorithm.

13. The method of claim 12, wherein the mathematical model is a linear time-invariant control system.

14. At least one non-transitory computer-readable storage medium having stored thereon data representing sequences of instructions that, when executed by a processor, cause the processor to perform operations comprising:

receiving a performance characteristic of a memory device, the performance characteristic associated with a decoding process to decode codewords performed by a decoder of an error control coding (ECC) logic to control errors in data encoded in the memory device;

establishing a closed feedback loop with the decoder of the ECC logic, the decoder decoding data encoded in the memory device in the presence of errors in accordance with a decoding algorithm;

processing an output of the decoder obtained via the closed feedback loop in accordance with the performance characteristic, wherein processing the output of the decoder obtained via the closed feedback loop in accordance with the performance characteristic includes:

configuring a proportional-integral-differential (PID) controller with the performance characteristic; and causing the PID controller to process the output as a PID controller variable, including applying a correction to the output of the decoder over time; and adjusting a tuning parameter for tuning the decoding algorithm over time based on the processing of the output.

15. The medium of claim 14, wherein:

the decoding algorithm is a binary decoding algorithm, including a bit flip algorithm (BFA); and the output is a syndrome-weight that represents a current weight associated with a pattern of violated parity checks the decoder encountered while decoding data using the BFA and the tuning parameter is a bit flip threshold for determining when to flip a bit of a codeword during decoding, the bit flip threshold derived from the syndrome-weight.

16. The medium of claim 15, wherein the tuning parameter is a mapping between the syndrome-weight and a logic-strength value, the mapping capable of trading error-rate performance for error-floor performance, and vice versa, while decoding data using the BFA.

17. The medium of claim 14, wherein the tuning parameter for tuning the decoder is based on a mathematical model of the BFA modeling:

a bit-node update process in which a checksum is computed for each bit node of a codeword by summing up syndrome-weights and comparing the summed syndrome-weights against the BFA threshold to determine when to flip the bit node, and a syndrome-weight update process in which, upon completing the bit-node update process, a first syndrome-weight bit is used to record a syndrome and a second syndrome-weight bit is used to record a confidence in the syndrome-weight, the confidence in the syndrome-weight lowered if the bit node was flipped; and further wherein the mathematical model of the BFA identifies control variables capable of output via the closed feedback loop for adjusting the one or more tuning parameters.

18. The medium of claim 14, wherein the PID controller is any one of a continuous time PID controller that processes the output as a PID controller variable continuously over time and a discrete time PID controller that processes the output as a PID controller variable at any one of predetermined intervals of time or in response to a triggering event.

19. The medium of claim 14, wherein the PID controller is based on a mathematical model of the decoding algorithm as a control system having one or more PID controller variables that correspond to the tuning parameters of the decoding algorithm.

20. The medium of claim 19, wherein the mathematical model is a linear time-invariant control system.

* * * * *